United States Patent
Chen et al.

(10) Patent No.: US 11,726,062 B2
(45) Date of Patent: Aug. 15, 2023

(54) MAGNETIC LAYER CHARACTERIZATION SYSTEM AND METHOD

(71) Applicant: Taiwan Semiconductor Manufacturing Company, Ltd., Hsinchu (TW)

(72) Inventors: Chia-Hsiang Chen, Hsinchu (TW); Chia Yu Wang, Hsinchu (TW); Meng-Chun Shih, Hsinchu (TW)

(73) Assignee: Taiwan Semiconductor Manufacturing Company LTD, Hsinchu (TW)

( * ) Notice: Subject to any disclaimer, the term of this patent is extended or adjusted under 35 U.S.C. 154(b) by 0 days.

(21) Appl. No.: 17/308,360

(22) Filed: May 5, 2021

(65) Prior Publication Data

US 2022/0299474 A1    Sep. 22, 2022

Related U.S. Application Data

(60) Provisional application No. 63/163,317, filed on Mar. 19, 2021.

(51) Int. Cl.
| | |
|---|---|
| *G01N 27/72* | (2006.01) |
| *H01P 3/00* | (2006.01) |
| *H01F 7/02* | (2006.01) |

(52) U.S. Cl.
CPC ............ *G01N 27/72* (2013.01); *H01F 7/02* (2013.01); *H01P 3/003* (2013.01)

(58) Field of Classification Search
CPC ............ G01N 27/72; H01F 7/02; H01P 3/003
See application file for complete search history.

(56) References Cited

U.S. PATENT DOCUMENTS

| | | | |
|---|---|---|---|
| 2019/0049514 A1* | 2/2019 | O'Brien | G01N 24/10 |
| 2020/0049787 A1* | 2/2020 | Guisan | G01N 24/10 |

FOREIGN PATENT DOCUMENTS

JP    2015206641 A   *   11/2015

OTHER PUBLICATIONS

Tamaru et al., Vector network analyzer ferromagnetic resonance spectrometer with field differential detection, Rev. Sci. Instrum. 89, 053901, 2018 (Year: 2018).*

* cited by examiner

*Primary Examiner* — Daniel R Miller
(74) *Attorney, Agent, or Firm* — Lippes Mathias LLP

(57) ABSTRACT

In a method of testing a multilayer structure containing a magnetic layer, one or more network parameters are measured of a waveguide that is electromagnetically coupled with the multilayer structure as a function of frequency and as a function of a magnetic field applied to the multilayer structure during the measuring of the network parameters. Based on the measured one or more network parameters, at least one magnetic property of the magnetic layer of the multilayer structure is determined. The network parameters in some embodiments are S-parameters. The at least one magnetic property may include an effective anisotropy field of the magnetic layer and/or a damping constant of the magnetic layer.

20 Claims, 11 Drawing Sheets

SECTION S-S

MAGNETIC LAYER CHARACTERIZATION SYSTEM AND METHOD

This application claims the benefit of U.S. provisional application Ser. No. 63/163,317 filed Mar. 19, 2021 and titled MAGNETIC LAYER CHARACTERIZATION SYSTEM AND METHOD. U.S. provisional application Ser. No. 63/163,317 filed Mar. 19, 2021 and titled MAGNETIC LAYER CHARACTERIZATION SYSTEM AND METHOD is incorporated herein by reference in its entirety.

BACKGROUND

The following relates to test devices and methods for characterizing a magnetic layer in a multilayer structure, to test devices and methods for testing magnetic and magnetoelectric devices, to the characterization of magnetic and magnetoelectric devices such as magnetoresistive random access memory (MRAM), hard disk drive component devices, magnetic sensor devices and so forth, to apparatuses and methods for the measurement of magnetic layer properties, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
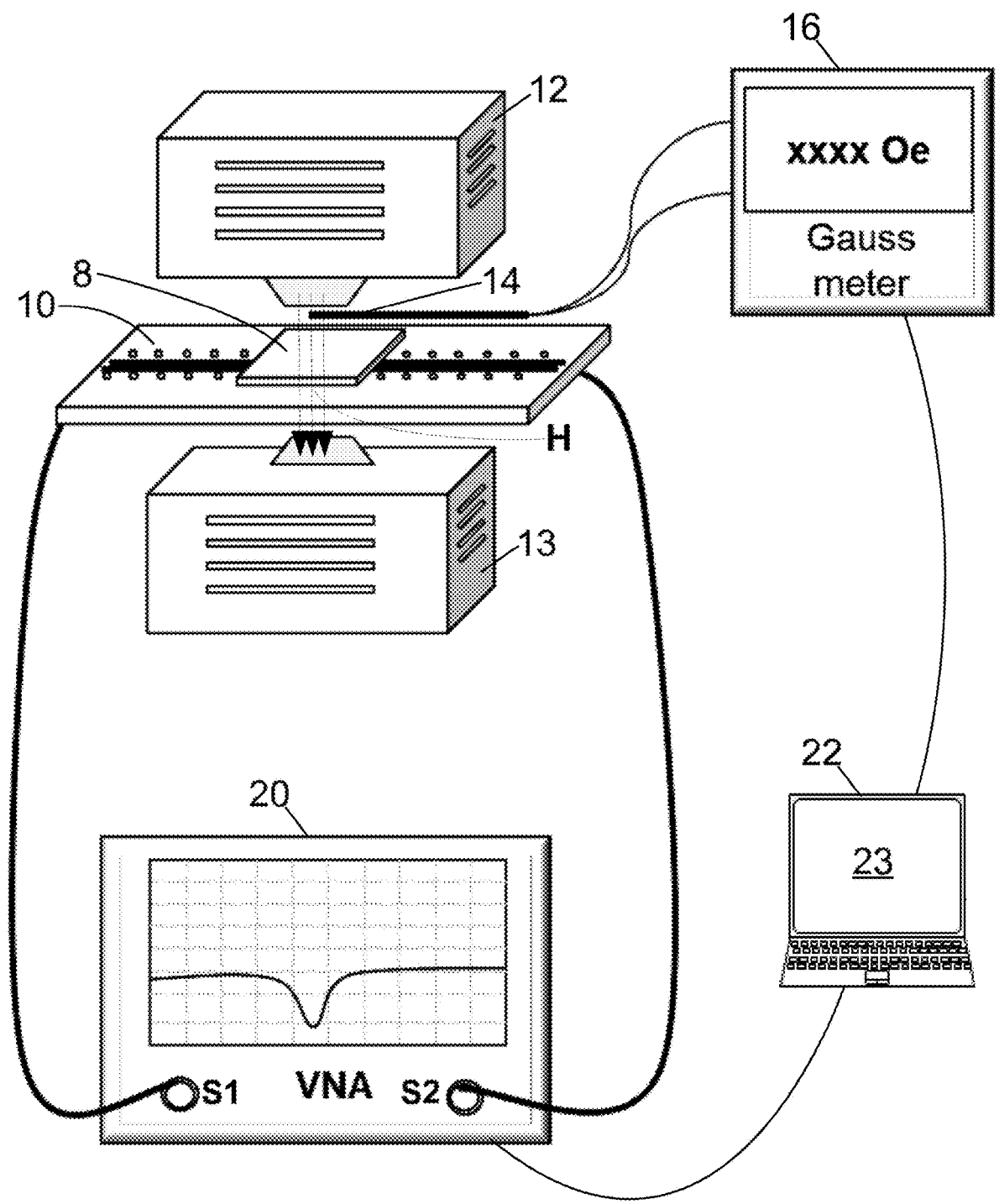
FIG. 1 diagrammatically illustrates a test apparatus for characterizing a magnetic layer in a multilayer structure according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Multi-layer structures that include one or more magnetic layers are used in various products, such as by way of non-limiting illustrative example: magneto-resistive random access memory (MRAM), hard disk drive (HDD) components, magnetic sensors, and so forth. As a specific example, MRAM includes a magnetic multilayer structure with a magnetic layer, and the magnetic layer properties impact the MRAM performance. Since the property of a magnetic layer with versus without adjacent layers could be significantly different, a method to detect the property of the magnetic layer in situ is advantageous. The magnetic layer (or layers) is advantageously analyzed in situ, that is, in the multi-layer structure, since the interaction with adjacent layers can in this way be taken into consideration. However, decoupling the signals of a magnetic layer from other layers of the multi-layer structure is difficult. Disclosed herein are methods and test apparatuses with good signal selectivity and depth resolution to characterize properties of a magnetic layer within a multi-layer structure.

Disclosed methods and apparatuses for testing magnetic layers in multilayer structures have certain advantages, some non-limiting examples of which include using a high frequency signal to achieve high signal selectivity between magnetic material and non-magnetic material, and directly probing one or more magnetic properties of a specific magnetic layer in a magnetic multilayer structure composed of magnetic and non-magnetic materials (such as, by way of non-limiting example, an MRAM film stack). A specific given embodiment may provide none, either one, or both these advantages.

In one non-limiting illustrative embodiment, a test apparatus for non-destructive detection and characterization of a magnetic layer in a multilayer structure comprises: a Network analyzer (NA) serving as a signal generator to provide a high frequency signal and as a signal analyzer to detect a signal change due to the interaction with a sample; a co-planar waveguide (CPW) serving as a signal transmission medium for high frequency signal propagation and sample interaction; and an electromagnet (EM) serving as a magnetic field source. The magnetic layer within the multilayer structure appears as an absorption peak or structure at a specific frequency (typically few to tens GHz for some typical magnetoelectric devices such as MRAM) due to the resonance of the magnetic material. The position of the absorption peak or structure varies with the applied magnetic field (which may, for example, be a static magnetic field provided by the electromagnet). By analyzing the peak position (that is, the resonance frequency of the absorption peak or structure) and full width at half maximum (FWHM; also denoted herein as $\Delta f$) of the absorption peak (or more generally, absorption structure), the effective anisotropy field ($H_k^{eff}$) and damping constant, respectively, are suitably determined.

With reference to FIG. 1, a test apparatus for testing a device under test (DUT) 8 is described. More particularly, the test apparatus characterizes a magnetic layer in the DUT 8 in terms of one or more magnetic properties of the magnetic layer. The DUT 8 is a multilayer structure containing a magnetic layer (that is, at least one magnetic layer). The illustrative test apparatus of FIG. 1 includes a waveguide 10 that is configured to electromagnetically couple with the multilayer structure 8. That is, the waveguide 10 is configured to electromagnetically couple with the DUT 8, typically at radio frequency (RF), and in some non-limiting illustrative embodiments at an RF frequency that is in the gigahertz (GHz) range. A magnet 12, 13 is arranged to superimpose a magnetic field H on the DUT 8, as well as to a magnetic field sensor 14 that is placed in the magnetic field H for the purpose of measuring the superimposed magnetic field H. The illustrative magnet 12, 13 of FIG. 1 includes a first pole 12 and a second pole 13 of an electromagnet 12, 13. For the direction of the magnetic field H shown, the first pole 12 is a north pole of the magnet and the second pole 13 is the south pole of the magnet; however, the polarity of the magnet can be opposite of this illustrative orientation; that is, the north and south poles can be swapped. The magnetic field sensor 14 is connected to an illustrative Gaussmeter 16 or other magnetic sensor readout device which, in the illustrative example, outputs the magnitude of the magnetic field H in units of oersted (Oe), although other magnetic field units such as milliGauss, Tesla, or so forth are contemplated. Moreover, while measurement of the applied magnetic field H is illustrated, in a variant embodiment the magnet 12, 13 is pre-calibrated so that the magnetic field H is determined in open-loop fashion from the electrical current energizing the electromagnet 12, 13 using a calibration look-up table—in this case, the magnetic field sensor 14 and Gaussmeter 16 are optionally omitted. While in the illustrative examples the magnetic field H is referred to herein as the H-field, it will be appreciated that the B-field could alternatively be measured since the magnetic field sensor 14 measures the magnetic field in air (or another non-magnetic ambient) so that the B-field ($|\bar{B}|$) is given by $|\bar{B}|=|\bar{H}|\mu_o$ where $\mu_o$ is the permeability of free space (e.g., air or vacuum or an inert gas atmosphere such as $N_2$).

The illustrative test device of FIG. 1 further includes a network analyzer 20 that is configured to measure network parameters of the waveguide 10 electromagnetically coupled with the DUT 8 with the magnet 12 superimposing the magnetic field H on the DUT 8. In the illustrative examples, the network analyzer 20 is a vector network analyzer (VNA) that measures scattering parameters (also referred to as S-parameters), and in the illustrative example the VNA 20 is connected to apply an RF excitation signal S1 and to measure an RF transmission signal S2. More generally, the network analyzer 20 is configured to measure network parameters such as S-parameters (as shown), or Y-parameters, Z-parameters, H-parameters, T-parameters, ABCD-parameters, various combinations thereof, and/or so forth. The measured electrical network includes the waveguide 10 which is electromagnetically coupled (e.g., at a GHz or other RF frequency in the illustrative examples) with the DUT 8 with the magnet 12, 13 superimposing the magnetic field H on the DUT 8.

With continuing reference to FIG. 1, an electronic processor 22, such as an illustrative computer 22, or a server computer, an electronic processor of the network analyzer 20, or so forth, is programmed to process the measured network parameters to determine at least one magnetic property of the magnetic layer of the associated multilayer structure (i.e. DUT 8). In illustrative examples, the measured network parameters are analyzed to extract, at each value of the magnetic field H, the resonance frequency and the FWHM of an absorption structure caused by absorption in the magnetic layer of the DUT 8. By analyzing the resonance frequency of the absorption peak or structure as a function of magnetic field H, the effective anisotropy field ($H_k^{eff}$) is determined. By analyzing the FWHM (i.e., $\Delta f$) of the absorption structure as a function of the resonance frequency, the damping constant is determined. While in the illustrative examples the effective anisotropy field ($H_k^{eff}$) and damping constant are the determined magnetic parameters of the magnetic layer, more generally other magnetic parameters of the magnetic layer can be similarly determined. In the non-limiting illustrative example, the electronic processor 22 comprises a computer with a display 23 on which the determined effective anisotropy field $H_k^{eff}$ and/or damping constant may be displayed.

Figure 2:
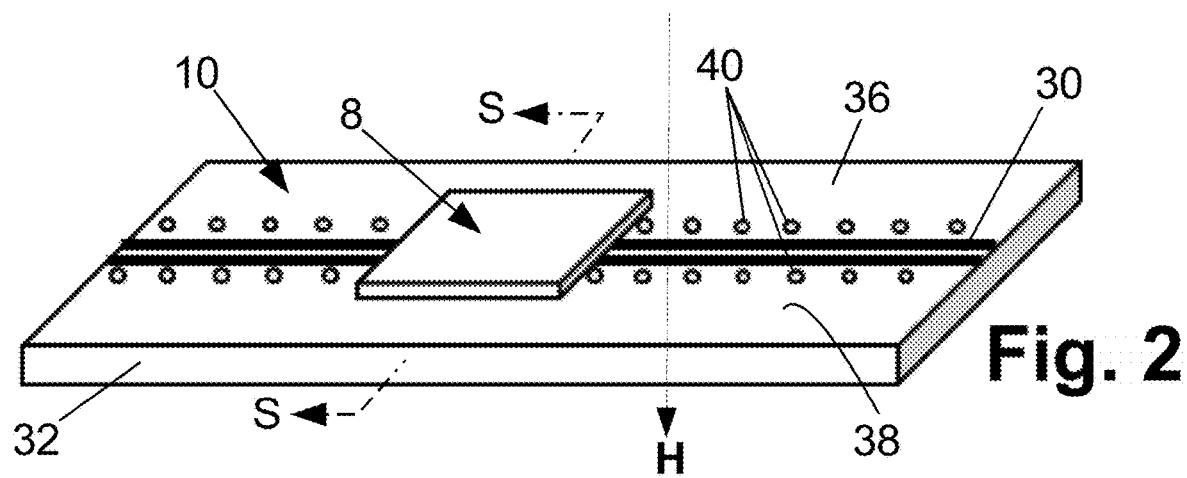
FIG. 2 diagrammatically illustrates a perspective isolation view of the waveguide and DUT of the apparatus of FIG. 1.
Figure 3:
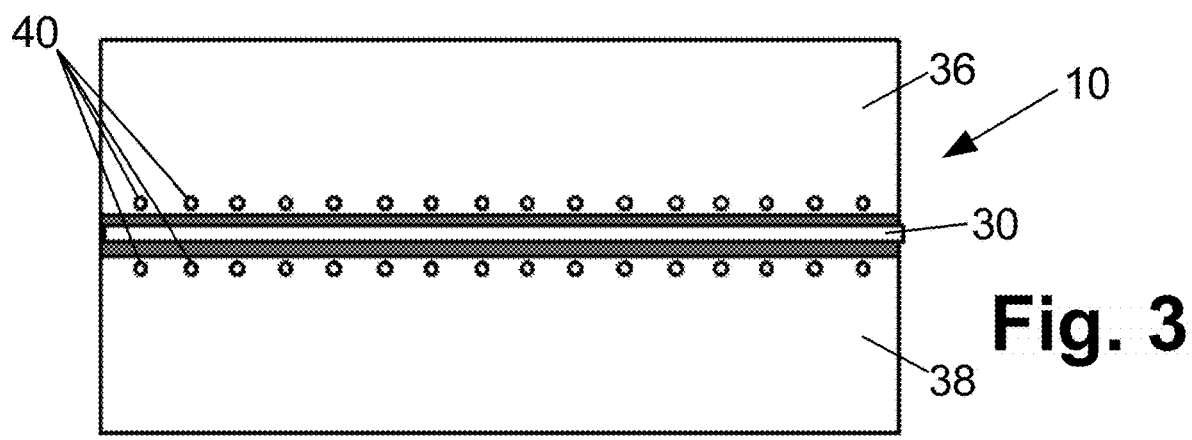
FIG. 3 diagrammatically illustrates a plan view of the waveguide of the apparatus of FIG. 1.
Figure 4:
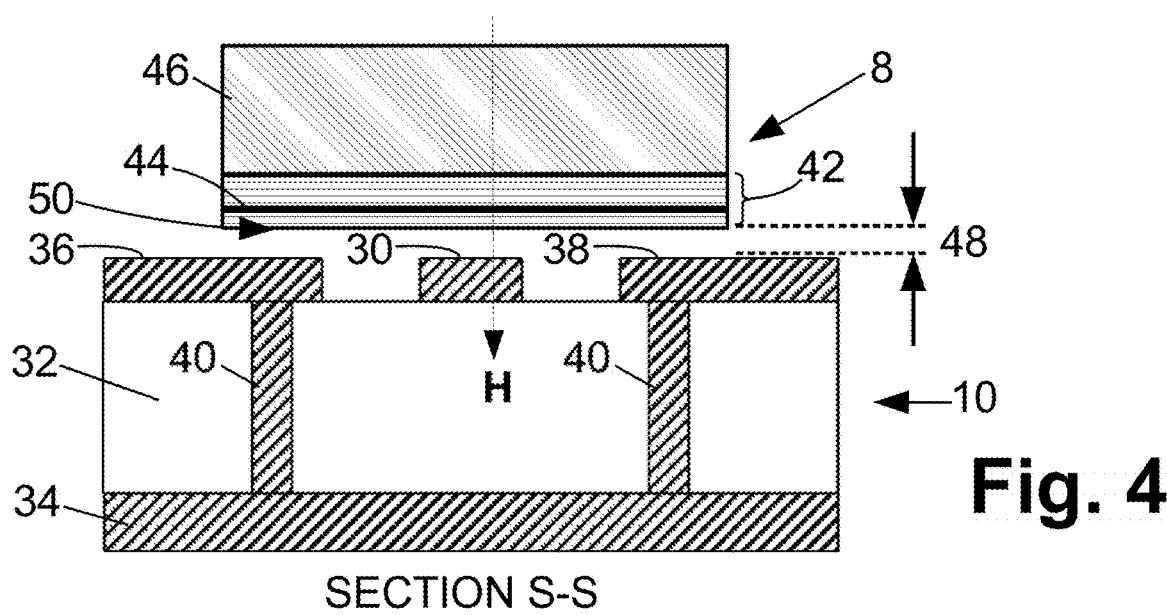
FIG. 4 diagrammatically illustrates SECTION S-S indicated in FIG. 2.

With continuing reference to FIG. 1 and with further reference FIGS. 2-4, the illustrative waveguide 10, and the electromagnetic coupling of the DUT 8 with the waveguide 10, is described in more detail. A perspective isolation view of the waveguide 10 and DUT 8 is presented in FIG. 2. A plan view of the waveguide 10 (without the DUT) is shown in FIG. 3. The SECTION S-S indicated in FIG. 2 is shown in FIG. 4. The illustrative waveguide 10 is a coplanar waveguide with ground (CPWG) that includes a signal line 30 disposed on a first side (referred to herein as a front side) of a dielectric board or substrate 32 and a ground plane 34 disposed on an opposite second side (referred to herein as a backside) of the dielectric board or substrate 32. The illustrative CPWG has a G-S-G structure on the front side of the CPWG, in which the G-S-G structure includes two parallel ground lines 36, 38 with the signal line 30 parallel with and disposed between the two parallel ground lines 36, 38. One or more electrically conductive vias 40 pass through the dielectric board or substrate 32 to connect the two parallel ground lines 36, 38 with the back side ground plane 34. In some non-limiting illustrative embodiments, the dielectric board or substrate 32 is an RO4003 laminate board, although other laminates or other insulating materials (e.g. FR4) may be used depending on the frequency range over which the DUT 8 is to be tested. If the VNA 20 is designed for 50-ohm then the waveguide 10 suitably presents a matched 50-ohm load to the VNA 20, although some deviation from the matched condition is contemplated, e.g. in some non-limiting embodiments the waveguide 10 is 50-ohm±10%. If other types of network parameters are to be measured then the waveguide may be configured with a suitable open or short circuit termination or the like.

With reference to FIG. 4, the DUT 8 includes a multilayer structure 42 with at least one magnetic layer 44. Typically, the multilayer structure 42 is disposed on a substrate 46 that provides the structural support for the DUT 8. In some non-limiting illustrative examples, the substrate 46 may be a silicon substrate or another type of semiconductor (e.g., gallium arsenide, indium phosphide, et cetera), or a silicon oxide (SiO$_x$) substrate, or a nonmagnetic metal substrate, or a ceramic substrate, or a quartz, or so forth. The magnetic layer 44 may comprise, by way of non-limiting illustrative example, iron (Fe), cobalt (Co), nickel (Ni), or other magnetic elements or alloys or compounds of magnetic elements. Other than the one or more magnetic layers 44, the multilayer structure 42 includes one or more layers comprising nonmagnetic materials, typically having relative permeability in a range of $0.9 \leq \mu_r \leq 1.1$ although nonmagnetic materials with $\mu_r$ outside of this range are also contemplated. The multilayer structure is disposed on the front side of the CPWG 10 with a gap 48 between the multilayer structure and the G-S-G structure. In some embodiments, the gap 48 is one millimeter or less; in general, a smaller value of the gap 48 improves the electromagnetic coupling between the waveguide 10 and the multilayer structure 8. To achieve a gap 48 of one millimeter or less in cases in which the substrate 46 of the DUT 8 is greater than one millimeter thick, the DUT 8 is suitably oriented as shown in FIG. 4, with the multilayer structure 42 (and more particularly a front side surface 50 of the multilayer structure 42) facing toward the G-S-G structure 30, 36, 38 and the substrate 46 facing away from (i.e. distal from) the G-S-G structure 30, 36, 38. The DUT 8 may be mounted on the waveguide 10 using a bonding agent such as a non-magnetic adhesive, an epoxy, a silicone glue, or so forth. In some embodiments, the spacing between the multilayer structure 42 and the G-S-G structure 30, 36, 38 is controlled by a solder mask coating on the CPWG 10 so that the DUT 8 can be physically placed into direct contact with the CPWG 10 with the solder mask ensuring the separation gap 48 in the electrical sense. In another approach, if the DUT 8 is a full wafer (e.g. a 3-inch silicon wafer) then the waveguide 10 may optionally include a conformably sized recess into which the silicon wafer DUT is placed—the recess can include support bosses or standoffs to hold the wafer at a precise distance from the G-S-G structure 30, 36, 38. In some such approaches, adhesive or other bonding agent can optionally be omitted.

With reference to FIGS. 1, 2, and 4, the magnetic field H is in the illustrative embodiment oriented perpendicular to the direction of the signal line 30 of the waveguide 10. This will generally provide the strongest resonant absorption in the magnetic layer 44; however, some deviation from this orientation is contemplated. The illustrative signal line 30 is straight; however, it is contemplated for the signal line to have a serpentine shape or other geometric configuration proximate to the placement of the DUT 8. Moreover, while the illustrative waveguide 10 is a CPWG having the G-S-G structure 30, 36, 38, other types of waveguides can be used so long as the waveguide can electromagnetically couple with the DUT 8. For example, an embodiment in which the waveguide is a microstrip that includes the signal line 30 and backside ground plane 34 but which omits the two parallel ground lines 36, 38 is also contemplated.

Figure 5:
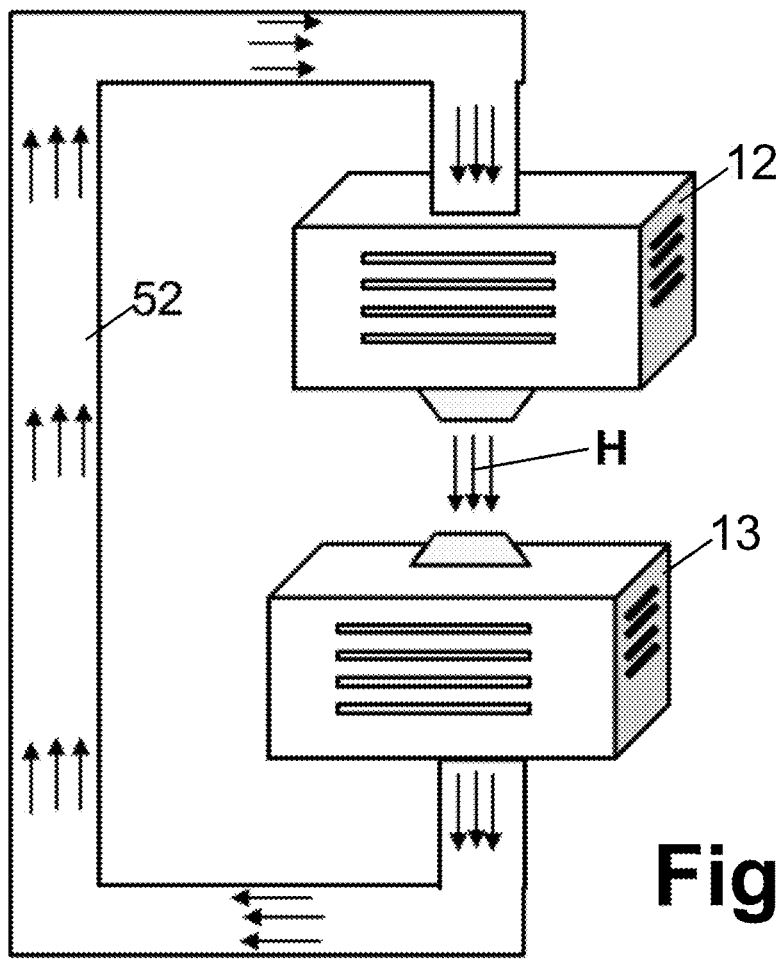
FIGS. 5 and 6 diagrammatically illustrate two non-limiting illustrative embodiments of the magnet of the apparatus of FIG. 1.
Figure 6:
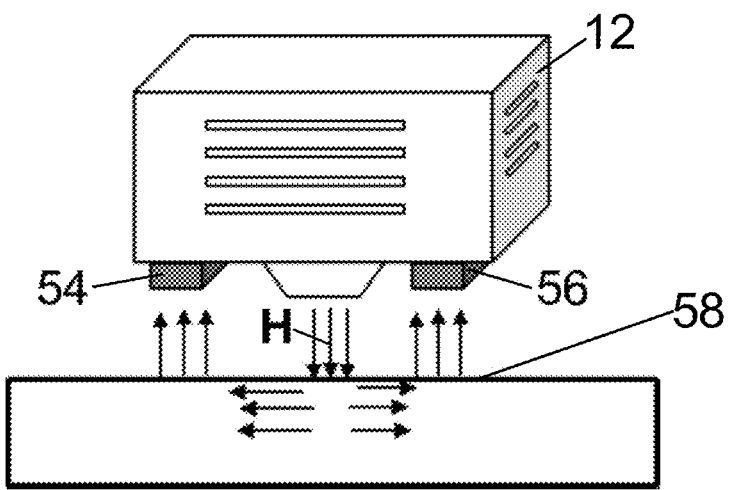
Figure 12:
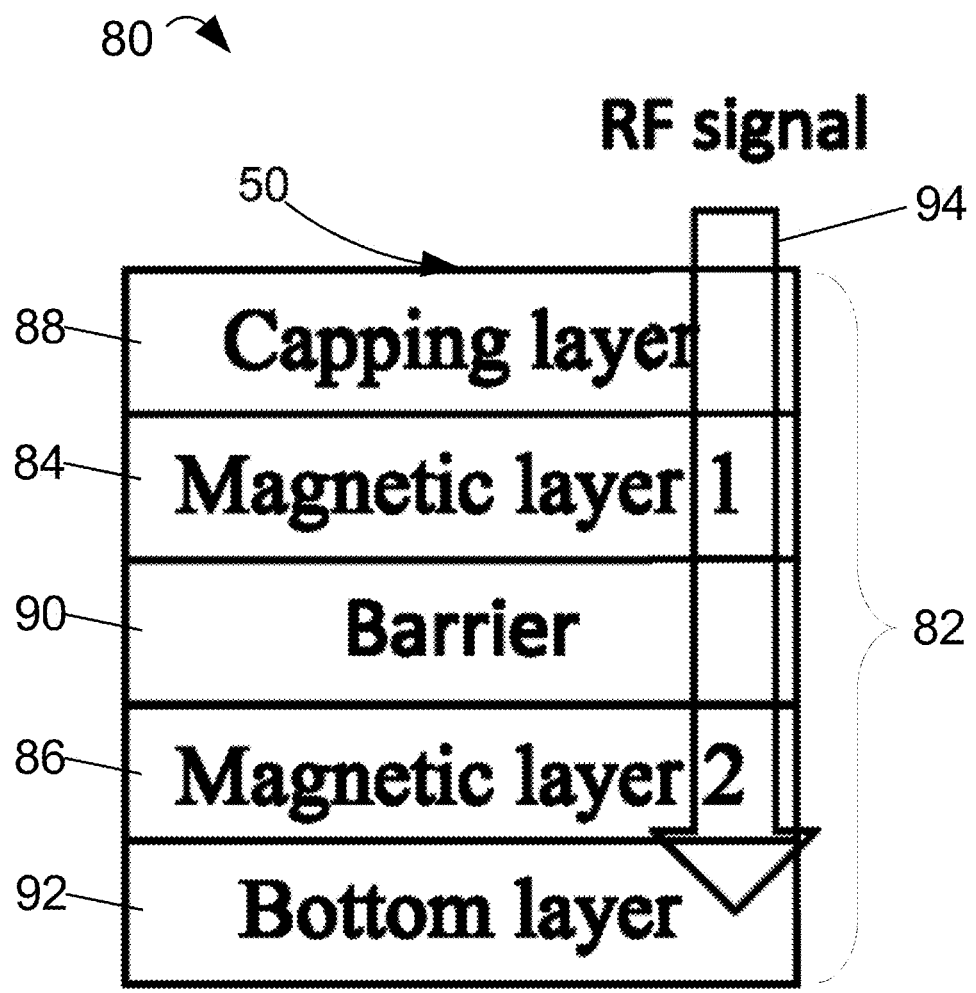
FIG. 12 diagrammatically illustrates a magneto-resistive random access memory (MRAM) structure used for experimental measurements.
Figure 13:
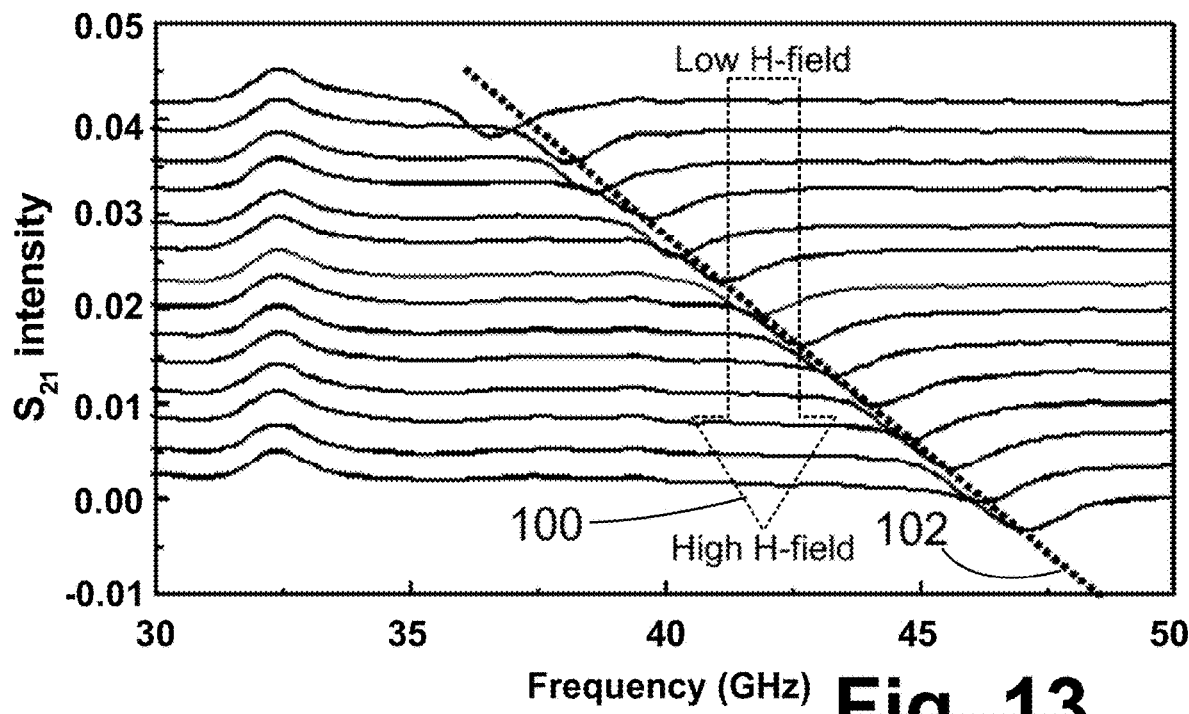
FIGS. 13-15 present experimental results for characterization of the MRAM structure of FIG. 12.

With reference to FIG. 1 and with further reference now to FIGS. 5 and 6, the magnet 12, 13 can be variously configured. FIGS. 12 and 13 illustrate two non-limiting examples. The magnet of FIG. 5 is a dual pole electromagnet that includes the first magnet pole 12 and the second magnet pole 13 connected by a magnetic flux path 52 made of a high magnetic permeability material such as cobalt (Co), iron (Fe), a high permeability steel, a CoFe alloy, or so forth. The magnet of FIG. 6 is a single pole electromagnet that includes the first magnetic pole 12 but replaces the second magnetic pole with two second pole faces 54, 56 symmetrically placed on opposite sides of the pole face of the first magnetic pole 12. A flux-spreading and flux-enhancing plate 58 provides for flux return from the first magnetic pole 12 to the two second pole faces 52, 54. The plate 58 is made of a high magnetic permeability material such as cobalt (Co), iron (Fe), a high permeability steel, a CoFe alloy, or so forth. These are merely illustrative examples, and more generally an electromagnet of any configuration capable of generating the magnetic field H can be used.

Figure 7:
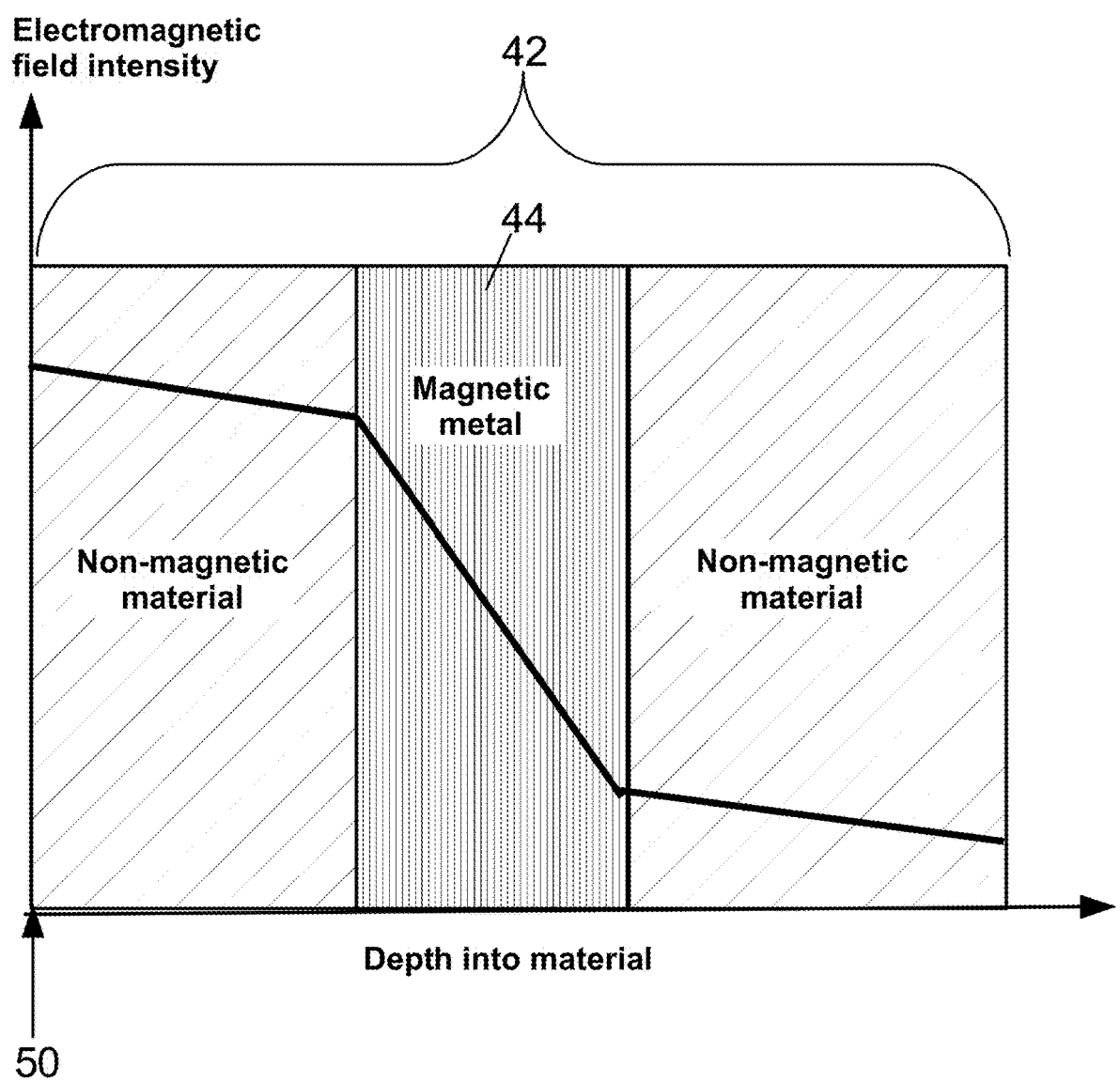
FIGS. 7-9 diagrammatically illustrate some operating principles of certain embodiments disclosed herein.

With reference to FIG. 7, when a high frequency signal passes through the multilayer structure 42, most signal absorption occurs in the magnetic layer 44. This is diagrammatically illustrated in FIG. 7 by plotting the electromagnetic field intensity as a function of depth for an RF signal (e.g., in the GHz range in some embodiments) impinging on the front side surface 50 of the multilayer structure 42. As seen, the electromagnetic field intensity decreases mostly in the magnetic layer 44, corresponding to absorption of the electromagnetic field predominantly in the magnetic layer 44. Note that while FIG. 7 and some other illustrative examples shown herein include only two nonmagnetic layers with the magnetic layer 44 disposed between these two nonmagnetic layers, more generally the multilayer structure may include substantially any number of nonmagnetic layers, which may comprise either the same or different materials. Likewise, while a single magnetic layer 44 is shown in FIG. 7 more generally the multilayer structure 42 may include one, two, three, or more magnetic layers.

In a DUT in which the multilayer structure includes two or more magnetic layers, the characterization apparatuses and methods disclosed herein are most sensitive to the magnetic layer nearest to the surface 50 of the magnetoelectric multilayer structure 42. This is beneficial, because in many magnetoelectric devices (e.g., an MRAM), the magnetic layer nearest to the surface of the multilayer structure most strongly impacts device performance. However, the characterization apparatuses and methods disclosed herein are also expected to be effective for measuring magnetic properties of the second (or more) magnetic layers further from the surface.

These sensitivity aspects are best understood by considering the skin depth, that is, the depth of penetration of an RF signal into a material. The typical skin depth of metals is on the order of hundreds of nanometers (nm) at gigahertz (GHz) frequencies. Additionally, the skin depth is frequency-dependent. Therefore, good spatial resolution is achieved to within a few hundred nm by control the signal frequency to probe the specific multilayer structure. More particularly, the skin depth $\delta$ is:

$$\delta = \sqrt{\frac{\rho}{\pi f \mu}} = \sqrt{\frac{\rho}{\pi f \mu_r \mu_0}} \quad (1)$$

where $\rho$ is the resistivity of the material, $f$ is the frequency at which the skin depth is measured, $\mu_r$ is the relative permeability of the material, $\mu_o = 4\pi \times 10^{-7}$ H/m is the vacuum permeability constant, and $\mu = \mu_r \mu_o$. By way of two non-limiting illustrative examples, for copper (Cu): $\delta_{Cu}$(1 kHz)=2.1 mm, $\delta_{Cu}$(1 MHz)=67 µm, and $\delta_{Cu}$(1 GHz)=2.1 µm; while for iron (Fe): $\delta_{Fe}$(1 kHz)=0.16 mm, $\delta_{Fe}$(1 MHz)=5.03 µm, and $\delta_{Fe}$(1 GHz)=0.16 µm. When a magnetic multilayer is put under a magnetic field and an RF signal is applied, strong absorption caused by a magnetic layer appears. The RF signal intensity decay with the depth, as seen in FIG. 7. Therefore, it is recognized herein that in a multilayer structure with several magnetic layers, the absorption signal mainly comes from the magnetic layer at or near the surface. Hence, as the resonance frequency is proportional to applied magnetic field, by increasing the applied magnetic field the resonance frequency can be increased, which enables tuning the skin depth of RF signal. The higher the frequency, the thinner probing depth. Therefore, in a multilayer structure with two or more magnetic layers, the signals mainly come the near surface layer, but deeper magnetic layers can also be characterized by going to lower frequency (corresponding to larger skin depth as indicated in Equation (1)).

Figure 8:
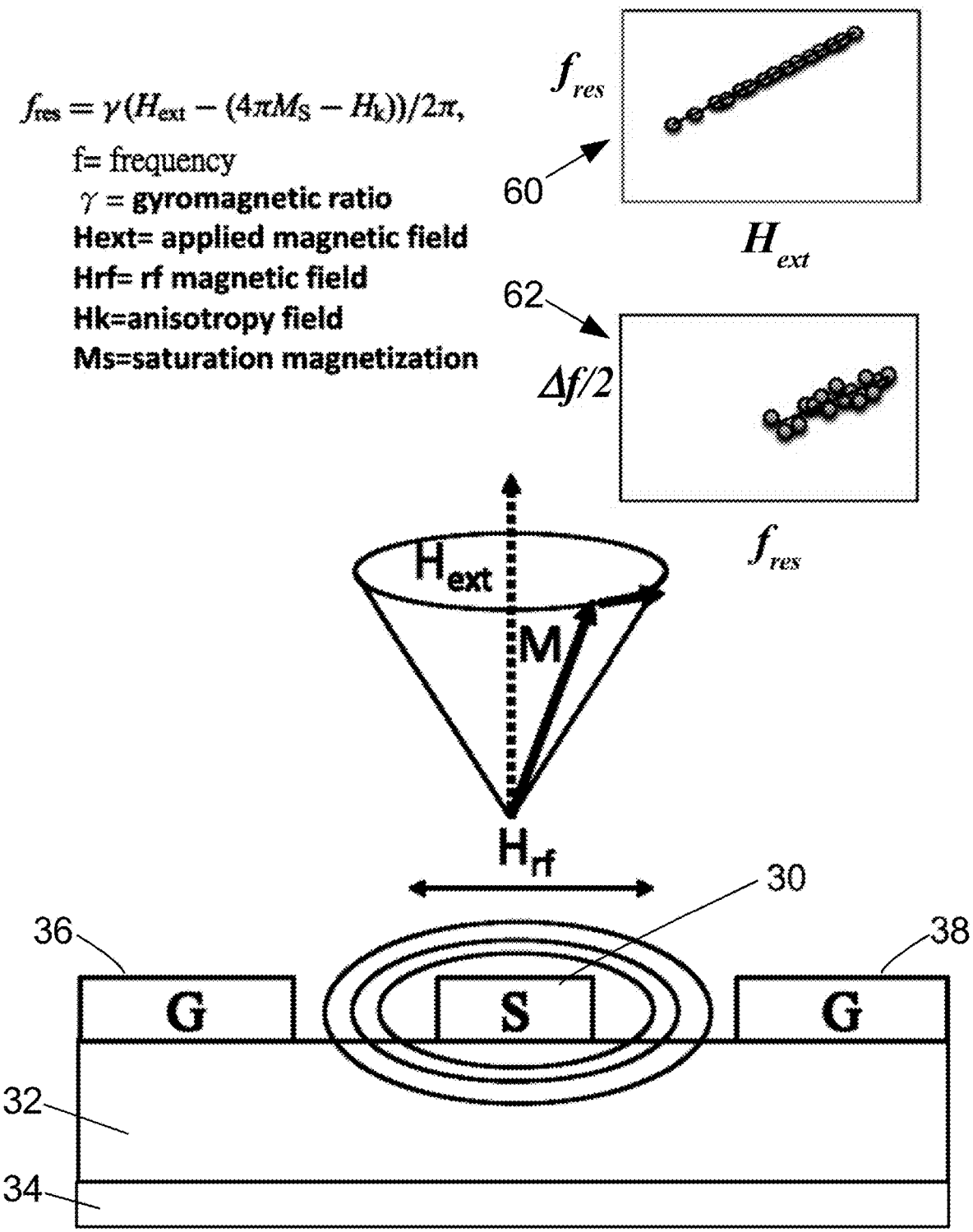

With reference to FIG. 8, without being limited to any particular theory of operation it is believed that the RF signals measured by the disclosed test apparatuses and methods operates based on a resonance effect in the magnetic layer 44. When the magnetic moment of the magnetic material is not aligned with the external magnetic field H, the magnetic moment precesses at a frequency $f$ as diagrammatically shown in FIG. 8. This frequency $f$ is proportional to the external magnetic field H. When the frequency of an applied RF signal matches the resonance frequency $f_{res}$ of the magnetic layer 44 at the magnetic field H, strong absorption occurs. The resonance frequency $f_{res}$ is given by:

$$f_{res} = \frac{\gamma(H_{ext} - (4\pi M_S - H_k))}{2\pi} \quad (2)$$

where $f_{res}$ is the resonant frequency, $\gamma$ is the gyrometric ratio, $H_{ext}$ is the applied magnetic field H, $H_{rf}$ is the RF magnetic field (see FIG. 8), $H_k$ is the anisotropy field, and $M_S$ is the saturation magnetization. Thus, the effective anisotropy field $H_k^{eff}$ (for example, given by $H_k^{eff}=H_k-4\pi M_S$ in one embodiment) can be extracted from a dataset of RF sweeps at different magnetic fields, by measuring the peak position ($f_{res}$) of the magnetic layer 44 as a function of $H_{ext}$ (corresponding to the applied magnetic field H) and deriving $H_k^{eff}$ and fitting Equation (2) to the resulting linear $f_{res}$ versus $H_{ext}$ curve. See, for example, the illustrative plot 60 of $f_{res}$ versus $H_{ext}$ presented in FIG. 8. The effective anisotropy field $H_k^{eff}$ is obtained from the intercept of the $f_{res}$ versus $H_{ext}$ line. Furthermore, the damping constant can be extracted from the variation in the full width at half maximum ($\Delta f$) of the absorption structure due to the resonance in the magnetic layer 44 versus the resonance frequency $f_{res}$, as shown in illustrative plot 62 of $\Delta f/2$ versus $f_{res}$ of FIG. 8. The damping constant (sometimes denoted as $\alpha$) is obtained from the slope of the $\Delta f/2$ versus $f_{res}$ line.

Figure 9:
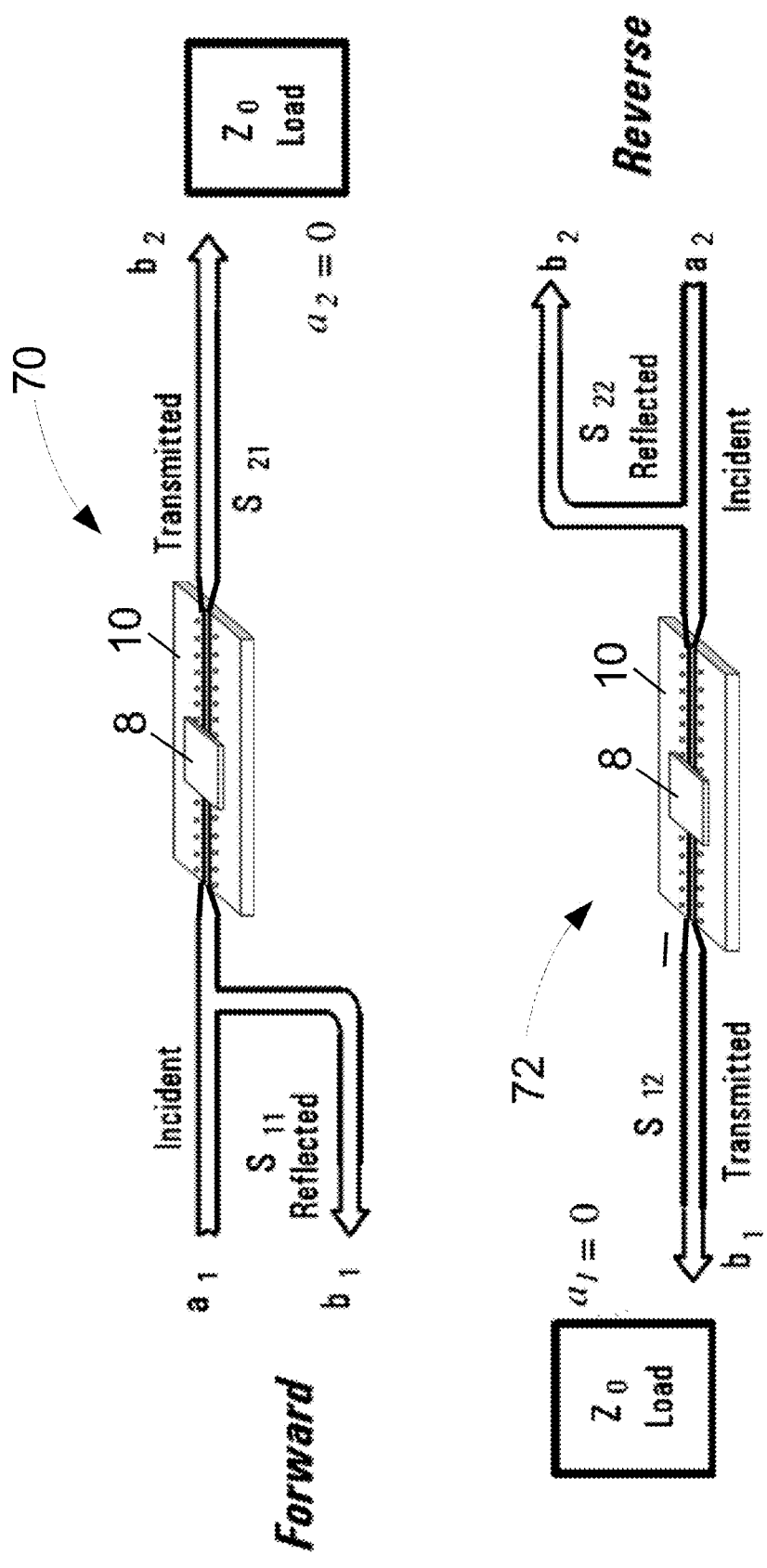

With reference to FIG. 9, the measurement of scattering parameters (S-parameters) by the network analyzer 20 is diagrammatically shown. In a top drawing 70, the incident RF signal that is applied to the waveguide 10 with the electromagnetically coupled DUT 8 is $\alpha_1$, and the measured RF signal is the transmitted signal $b_2$, so that the measured S-parameter is $$S_{21} = \frac{\text{Transmitted}}{\text{Incident}} = \frac{b_2}{a_1}|_{a_2=0}.$$

In a bottom drawing 72, the incident RF signal that is applied to the waveguide 10 with the electromagnetically coupled DUT 8 is $\alpha_2$, and the measured RF signal is the transmitted signal $b_1$, so that the measured S-parameter is $$S_{12} = \frac{\text{Transmitted}}{\text{Incident}} = \frac{b_1}{a_2}|_{a_1=0}.$$

In another embodiment (not shown in FIG. 9), the incident RF signal that is applied to the waveguide 10 with the electromagnetically coupled DUT 8 is $\alpha_1$, and the measured RF signal is the reflected signal $b_1$, so that the measured S-parameter is $$S_{11} = \frac{\text{Reflected}}{\text{Incident}} = \frac{b_1}{a_1}|_{a_2=0}.$$

In yet another embodiment (not shown in FIG. 9), the incident RF signal that is applied to the waveguide 10 with the electromagnetically coupled DUT 8 is $\alpha_2$, and the measured RF signal is the reflected signal $b_2$, so that the measured S-parameter is $$S_{22} = \frac{\text{Reflected}}{\text{Incident}} = \frac{b_2}{a_2}|_{a_1=0}.$$

For these measurements, if the VNA 20 is designed for 50-ohm then the waveguide 10 suitably presents a matched 50-ohm load to the VNA 20, e.g. the waveguide 10 is 50-ohm±10% in some non-limiting illustrative embodiments. If other types of network parameters are to be measured (e.g., Y-parameters, Z-parameters, H-parameters, T-parameters, and/or ABCD-parameters) then the waveguide 10 may be configured with a suitable open or short circuit termination or the like.

Figure 10:
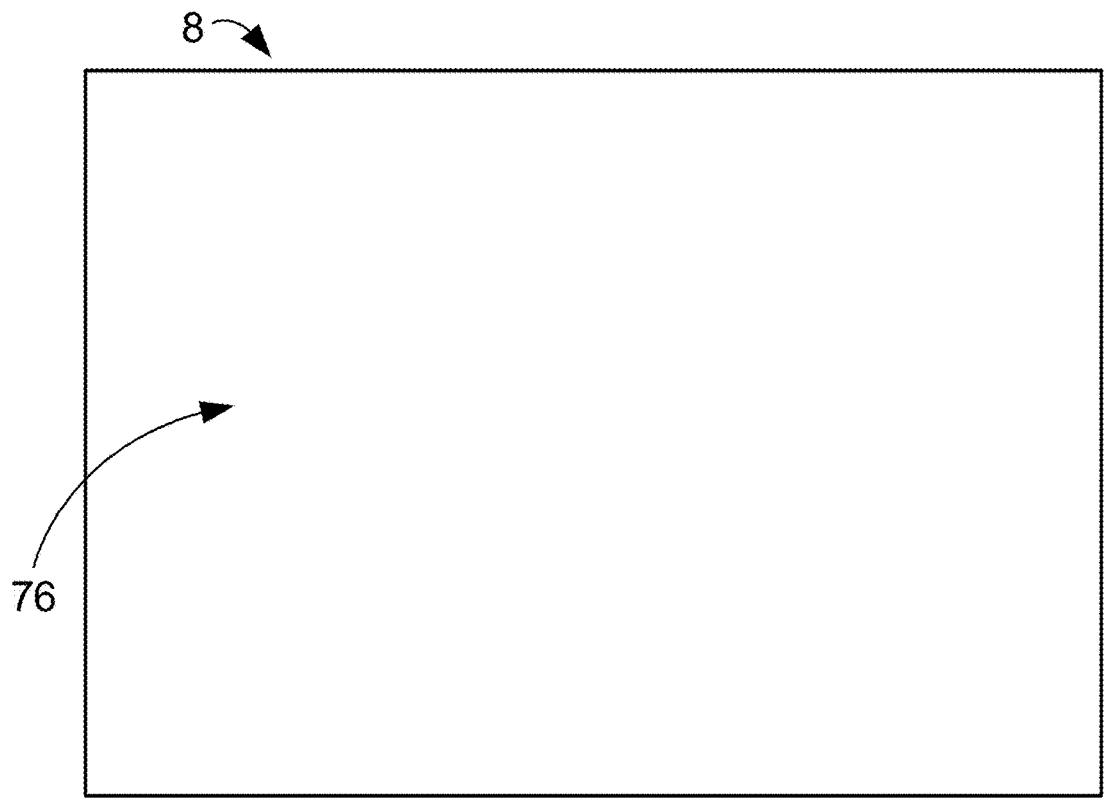
FIGS. 10 and 11 diagrammatically illustrate plan and side-sectional views, respectively, of a DUT having a continuous magnetic layer.
Figure 11:
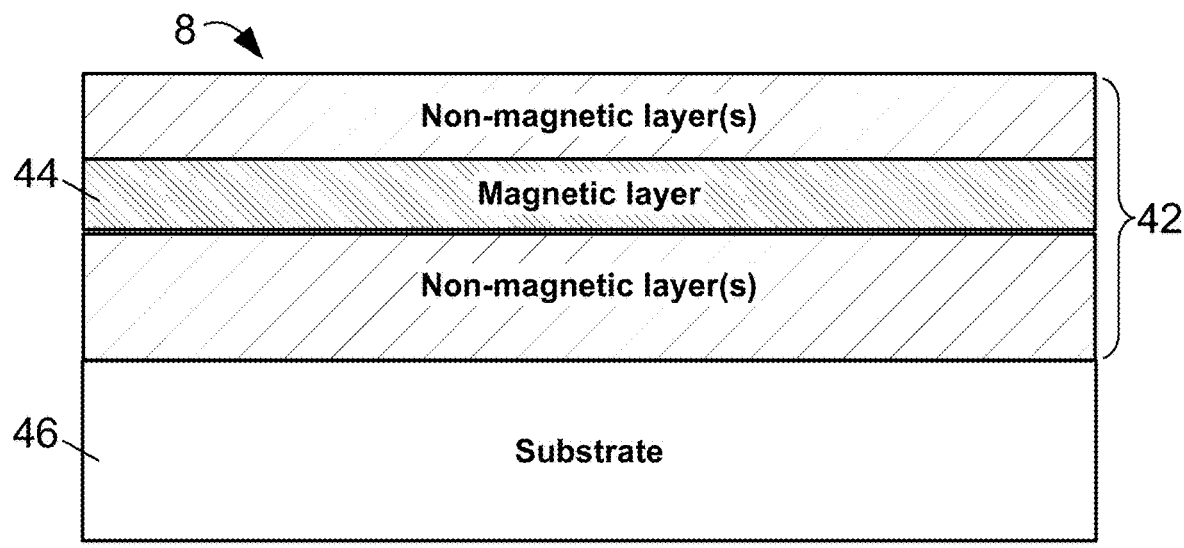

With reference to FIGS. 10 and 11, plan and side-sectional views, respectively, of a DUT 8 having a continuous multilayer stack 42 with a continuous magnetic layer 44 are shown. That is, the multilayer stack 42 forms a single simply connected area 76 (see FIG. 10), and the magnetic layer 44 is coextensive with the multilayer stack 42. In some non-limiting illustrative examples, the magnetic layer 44 may have a thickness of 100 nm or less, although magnetic layers of larger thickness are also contemplated. The non-magnetic layers of the multilayer stack 42 can have a wide range of thicknesses since the RF signal absorption is low in these layers (see FIG. 7 and related discussion). In some non-limiting illustrative embodiments, the non-magnetic layers have thickness in a range of 0.1 nm to 1000 nm although layer thicknesses outside of this range are also contemplated. In some non-limiting illustrative embodiments the magnetic layer 44 has a resistance of 100 ohm/sq or less, although magnetic layers of higher resistance are also contemplated.

With reference to FIG. 12, a magnetoresistive random access memory (MRAM) structure 80 is shown which served as the DUT 8 in actually performed experiments using a testing apparatus similar to that of FIG. 1. The MRAM structure 80 comprised a multilayer stack 82 with a top magnetic layer 84 a second, deeper magnetic layer 86, and non-magnetic layers 88, 90, 92. An arrow 94 indicates the direction of penetration of the RF signal from the waveguide 10 into the MRAM 80 starting from the frontside surface 50 of the multilayer structure 82.

Figure 14:
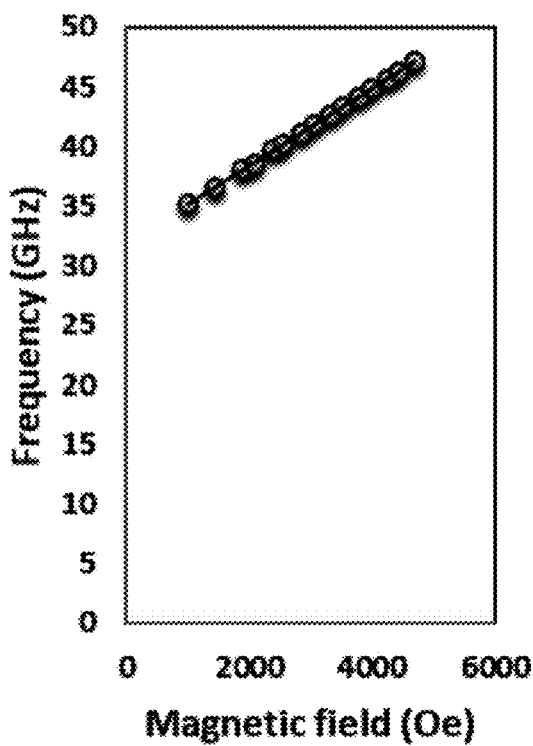
Figure 15:
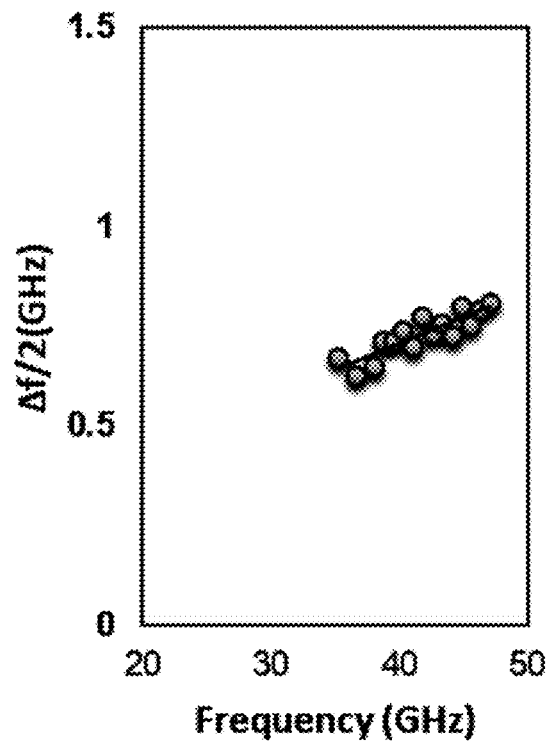

With reference to FIGS. 13-15, experimental data for the MRAM of FIG. 12 are shown, which were obtained using a test apparatus similar to that of FIG. 1. FIG. 13 plots the intensity of the measured network parameter $S_{21}$ as a function of RF frequency. Each generally horizontal data line shown in FIG. 13 corresponds to a single value of the applied magnetic field H, and the magnetic field intensity increases for the lower-plotted data-lines as indicated by the arrow 100. The data lines are normalized using the background peak at about 32.5 GHz (which is unrelated to the absorption in the magnetic layer 84) and offset vertically to spatially separate the data lines. The absorption peak or structure due to the magnetic layer 84 is the structure along the dotted line 102 indicated in FIG. 13. FIG. 14 plots the resonance frequency $f_{res}$ of the absorption peak or structure due to the magnetic layer 84 versus the applied magnetic field $H_{ext}$ (that is, the magnitude of the applied magnetic field H). FIG. 15 plots the full-width-at-half maximum $\Delta f$ of the absorption peak or structure due to the magnetic layer 84 as a function of the resonance frequency $f_{res}$.

As seen in FIG. 13, when the magnetic multilayer 82 is put under the magnetic field H (for example, applied by the magnet 12, 13 of FIG. 1) and an RF signal is applied (for example, by way of the network analyzer 20 of FIG. 1), strong absorption caused by a magnetic layer 84 appears. The RF signal intensity decays with the depth due to the frequency-dependent skin depth, as described previously with reference to Equation (1). Therefore, it is recognized herein that even in the multilayer MRAM structure 82 with several magnetic layers (specifically the illustrative two magnetic layers 84, 86 of the MRAM structure 82), the signal $S_{21}$ mainly comes the magnetic layer 84 at or near the surface 50. In other words, the absorption peak or structure along the dotted line 102 indicated in FIG. 13 is due to the magnetic layer 84, rather than being due to the deeper-buried magnetic layer 86. However, although not tested here, it is contemplated that by reducing the RF frequency of the input signal (e.g. signal $a_1$ for measurement of the S-parameter $S_{21}$) sufficiently, it may be possible to increase the skin depth as per Equation (1) so as to also extract information about the deeper-buried layer 86. The deeper-buried magnetic layer 86 is expected to exhibit as a second, weaker absorption peak or structure at lower frequency than the absorption peak or structure along dotted line 102 due to the magnetic layer 84.

In the MRAM structure 82, the effective anisotropy field $H_k^{eff}$ of the magnetic layer 44 correlates strongly with thermal stability and data retention in the final fabricated MRAM device. The damping constant α impacts write efficiency and the write current. Measuring these parameters of the continuous MRAM structure 80 provides validation of the magnetic layer 84 prior to fabrication of the MRAM device, thus enabling defective MRAM structure blanks to be discarded prior to costly manufacturing.

The MRAM fabrication process can impact the magnetic properties of the MRAM structure. Advantageously, the test apparatus of FIG. 1 can also be used to characterize the magnetic layer of a patterned multilayer structure, to assess the impact of the patterning on the magnetic layer.

Figure 16:
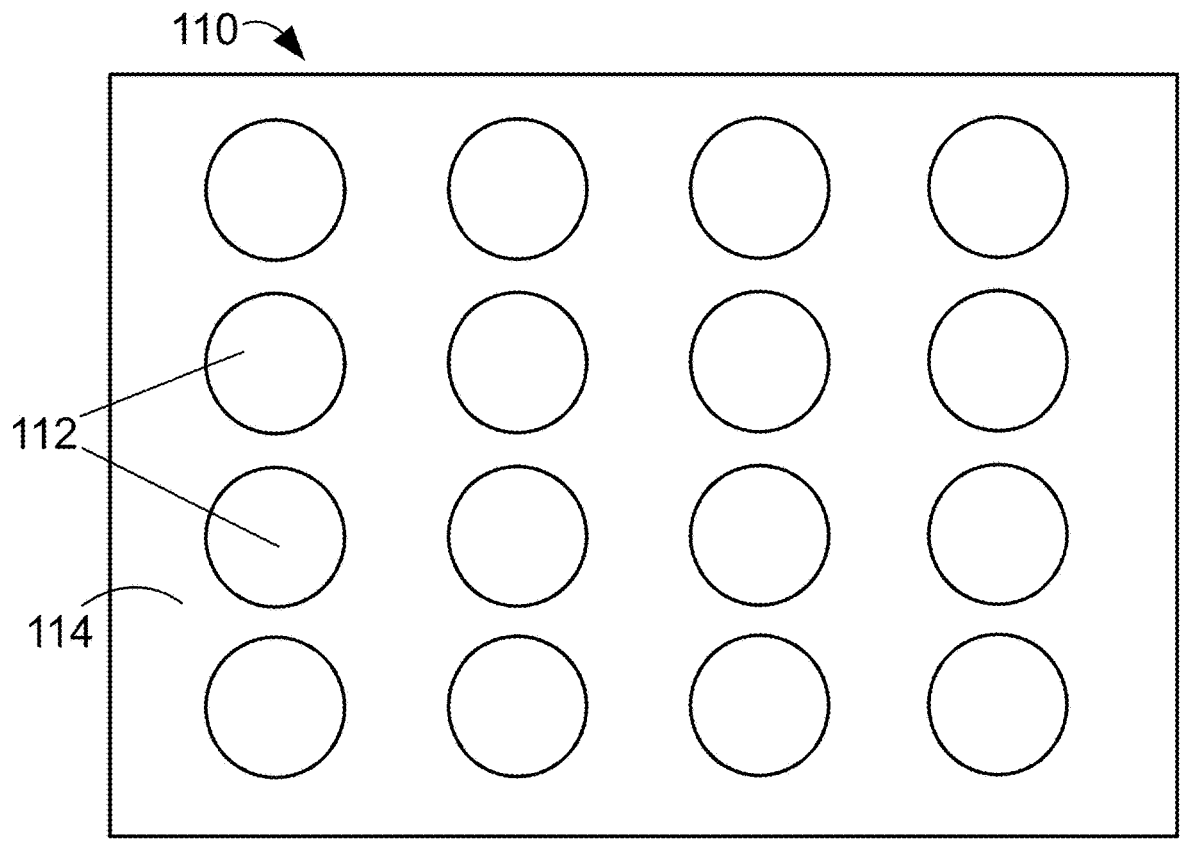
FIGS. 16 and 17 diagrammatically illustrate plan and side-sectional views, respectively, of a DUT having a patterned magnetic layer.
Figure 17:
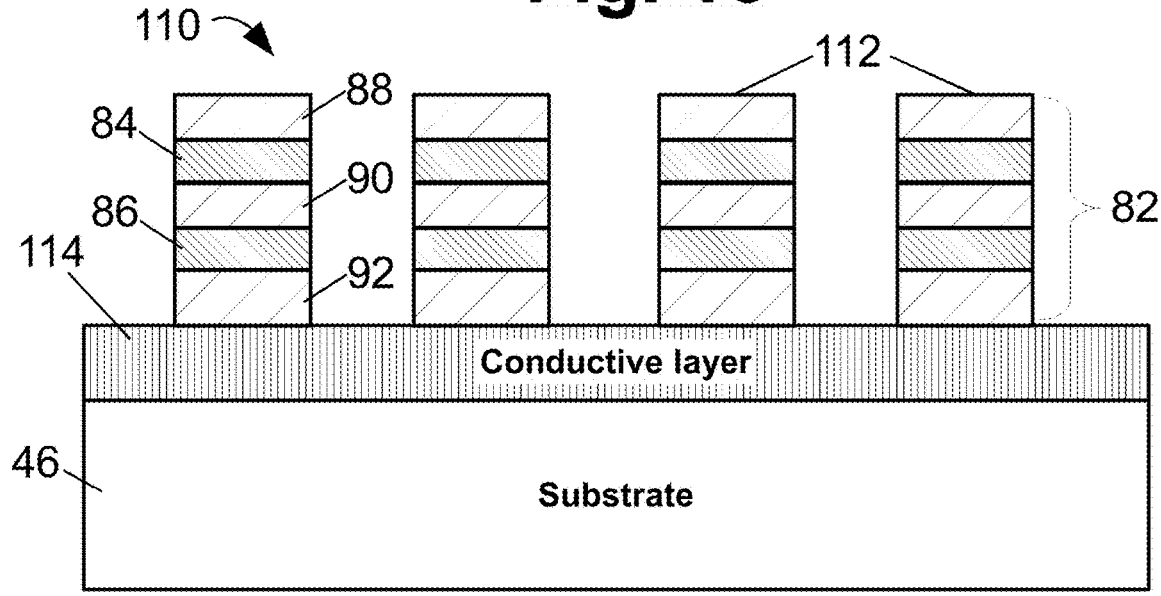

FIGS. 16 and 17 diagrammatically illustrate plan and side-sectional views, respectively, of a DUT 110 having a patterned magnetic layer. The illustrative DUT 110 has the MRAM multilayer stack 82 with top magnetic layer 84, deeper second magnetic layer 86, and non-magnetic layers 88, 90, 92, as in the MRAM 80 of FIG. 12. However, in the DUT 110 the multilayer stack 82 is patterned using a suitable patterning process (e.g., lithographically defined etching) to form a two-dimensional (2D) array of device mesas 112. Because the MRAM multilayer stack 82 of the DUT 110 is patterned to form mutually isolated mesas 112 (as opposed to being a continuous multilayer stack as in, for example, the continuous multilayer stack 42 with continuous magnetic layer 44 of the DUT 8 of FIGS. 10 and 11), the overall sheet resistance of the patterned multilayer stack can be high. To address this, the illustrative DUT 110 further includes an underlying continuous conductive layer 114 disposed on the substrate 46 and disposed underneath the patterned multilayer stack 82 and thereby providing reduced electrical resistance between the mutually isolated mesas 112. By way of non-limiting illustrative example, the conductive layer 10 may be a layer of copper (Cu), aluminum (Al), tantalum (Ta), titanium (Ti), CuN, TaN, TiN, or so forth. By way of non-limiting illustrative example, the conductive layer 10 may have a sheet resistance of 100 ohm/sq or lower. The magnetic properties of the magnetic layer 84 (and, in some contemplated embodiments, also the deeper magnetic layer 86) of the mesas 112 of the DUT 110 of FIGS. 16 and 17 can be characterized using the test apparatus of FIG. 1, in substantially the same was as the measurement of the continuous-layer MRAM 80 (see FIG. 12) as described with reference to FIGS. 13-15.

Figure 18:
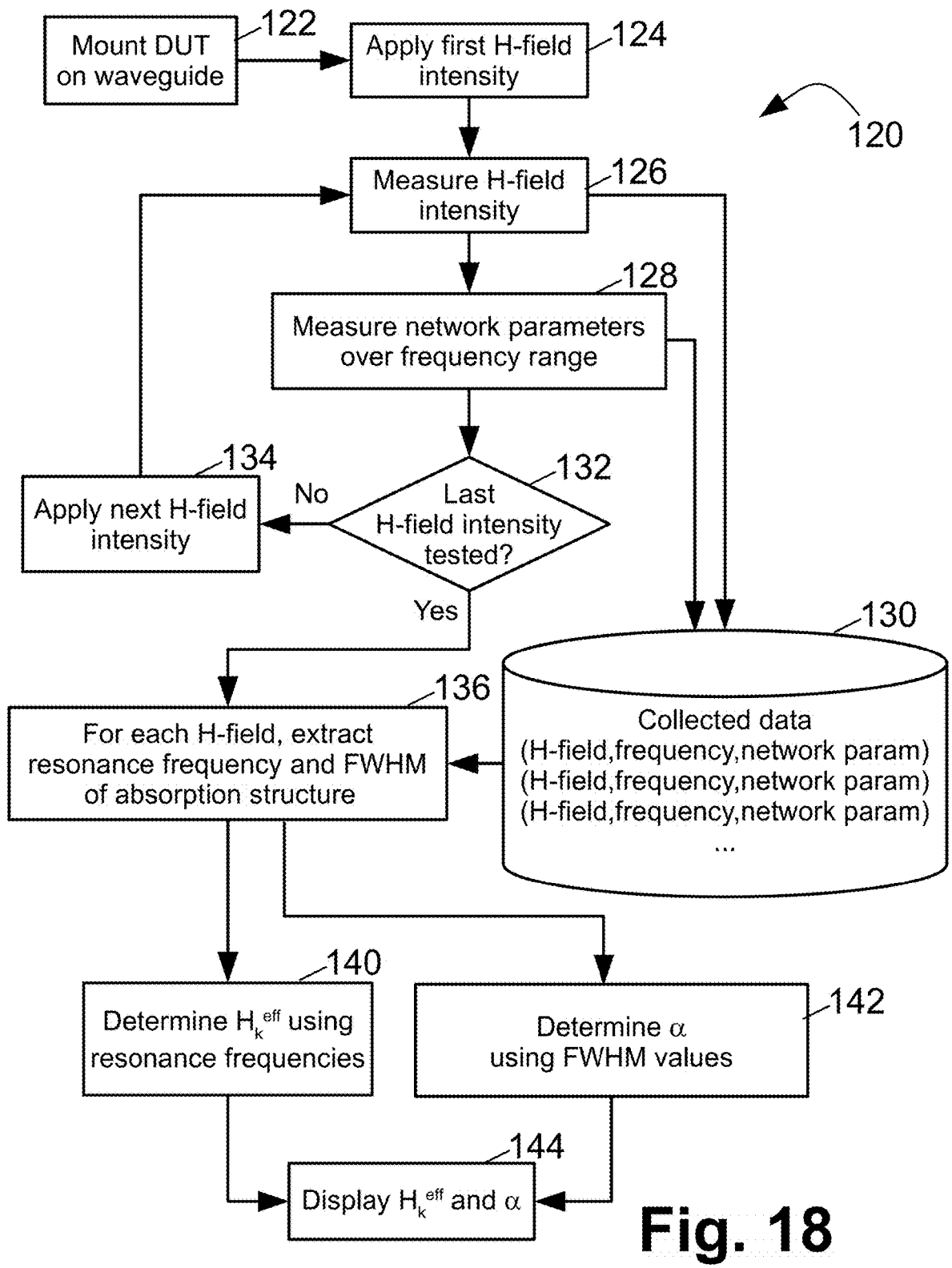
FIG. 18 diagrammatically illustrates a method for characterizing a magnetic layer in a multilayer structure according to an embodiment.

With reference now to FIG. 18, an illustrative test method 120 for characterizing a magnetic layer of a multilayer stack is described. The test method 120 of FIG. 18 is described herein with non-limiting illustrative reference to the test apparatus of FIG. 1, with which the test method 120 may be performed. However, other test apparatuses with the requisite hardware for performing the operations of the test method 120 (e.g., a suitable magnetic field source, a suitable waveguide, suitable electrical equipment to energize the waveguide at RF frequencies and measure the network parameters of the waveguide, et cetera) can be used to implement the test method 120 of FIG. 18.

In an operation 122, the DUT 8 is mounted on the waveguide 10. This can be done using a bonding agent (adhesive, epoxy, glue, et cetera) or by placing the DUT 8 into a conformably sized recess (not shown), for example. In an operation 124, the magnet 12, 13 is operated to apply the magnetic field H at a first magnetic field intensity. In an operation 126 performed after a suitable time after operation 124 for the magnet to stabilize, the applied magnetic field intensity is measured using the magnetic field sensor 14. Alternatively, if the magnetic field intensity is inferred from the electrical power used to energize the magnet 12, 13 in the operation 124, then the magnetic field measurement operation 126 is suitably omitted. In an operation 128, the S-parameters or other network parameters are measured over a chosen frequency range (e.g., over the frequency range 30-50 GHz in the non-limiting illustrative example of FIG. 13). Operation 128 is suitably performed by the VNA 20 which is programmed to: sweep the incident RF signal that is applied by the VNA to the waveguide 10 (e.g., applied to the input $a_1$ in the illustrative example of measuring $S_{21}$); and to measure the response RF signal (e.g., measure the transmitted signal $b_2$ in the illustrative example of measuring $S_{21}$) for each value of the incident RF signal sweep. While the illustrative VNA 20 is convenient for performing the operation 128, in other embodiments separate source and measurement electronic components may be provided for this purpose. The data for the RF sweep, including the magnetic field intensity measured at operation 126 (or, alternatively, inferred from the electrical power applied to the magnet 12, 13 using a look-up table or other empirical magnetic field-power relationship) and the values of $S_{21}$ at the measured steps of the RF sweep are stored in a buffer, database, or other collected data storage 130.

In a decision 132, it is determined whether the last magnetic field intensity over which measurements are to be acquired has been reached. If not, then flow passes to an operation 132 in which the magnet 12, 13 is operated to apply the next magnetic field intensity, and after stabilization of the magnet at that new intensity flow passes to the operation 126 to (optionally) measure the new magnetic field intensity and to acquire the next RF sweep.

When, at the decision 132, it is determined that the last magnetic field intensity over which measurements are to be acquired has been reached, flow passes to an operation 136 at which the collected data are retrieved from the storage 130 and the resonance frequency $f_{res}$ and FWHM (i.e. $\Delta f$) of the resonance caused by the magnetic layer 44 (for illustrative DUT 8) or by magnetic layer 84 (for DUT 80 or DUT 110) are determined for each RF sweep (that is, for each magnetic field intensity set in the operations 124, 134). The resonance peak and FWHM can be identified by various approaches such as by curve fitting of a matched filter representing the resonance structure, or by a peak detector algorithm detecting zeros in the first derivative (e.g., $$\frac{dS_{21}}{df} = 0$$

where $df$ is the RF frequency differential) of the sweep data, or so forth. The FWHM may be variously defined depending on the detailed shape of the resonance structure. While "full-width-at-half-maximum" is used herein, more generally a characteristic width of the resonance structure is suitably determined at the operation 136, which is referred to herein as the FWHM or $\Delta f$. In an operation 140, the effective anisotropy field $H_k^{eff}$ is determined using the resonance frequencies, for example by fitting Equation (2) to the $f_{res}$ versus $H_{ext}$ data as previously described. In an operation 142, the damping constant $\alpha$ is determined from the slope of the $\Delta f/2$ versus $f_{res}$ line. In an operation 144, the resulting information (e.g., determined $H_k^{eff}$ and/or determined $\alpha$, optionally along with underlying data such as the RF sweep data as shown by way of example in FIG. 13 and/or the derived plots of FIGS. 14 and/or 15) are suitably displayed on the display 23 of the computer 22 or other electronic processor. Although the method 120 determines both $H_k^{eff}$ and $\alpha$, it is alternatively contemplated to determine only one of these values in some embodiments. In another variant, a differently formulated magnetic parameter of the magnetic layer may be displayed.

The illustrative test method 120 of FIG. 18 may be mostly automated if the magnet 12, 13 and VNA 20 and optional magnetic sensor readout device 16 are computerized and the electronic processor 22 has digital connections (e.g. USB connections or the like, or wireless Bluetooth connections or the like) to control these devices in accordance with a program. In such a case, the only manual operations may be the initial DUT mounting operation 122 and possibly the test startup in some embodiments.

In the following, some additional embodiments are described.

In a nonlimiting illustrative embodiment, a test device is disclosed for measuring at least one magnetic parameter of an associated multilayer structure containing a magnetic layer. The test device includes a waveguide, a magnet, and a network analyzer. The waveguide is configured to electromagnetically couple with the associated multilayer structure. The magnet is arranged to superimpose a magnetic field on the associated multilayer structure and a magnetic field sensor. The network analyzer is configured to measure network parameters of the waveguide electromagnetically coupled with the associated multilayer structure with the magnet superimposing the magnetic field on the associated multilayer structure. In some such embodiments, the test device further includes an electronic processor programmed to process the measured network parameters to determine at least one magnetic property of the magnetic layer of the associated multilayer structure.

In a nonlimiting illustrative embodiment, a test device is disclosed for measuring at least one magnetic parameter of an associated multilayer structure containing a magnetic layer. The test device includes a waveguide, a magnet, a network analyzer, and an electronic processor. The waveguide is configured to electromagnetically couple with the associated multilayer structure. The magnet is arranged to superimpose a magnetic field on the associated multilayer structure electromagnetically coupled with the waveguide. The network analyzer is configured to measure S-parameters of the waveguide with the associated multilayer structure electromagnetically coupled with the waveguide and with the magnet superimposing the magnetic field on the associated multilayer structure electromagnetically coupled with the waveguide. The electronic processor is programmed to control the network analyzer and the magnet to vary a frequency of an electromagnetic signal applied to the waveguide by the network analyzer and a magnetic field applied by the magnet during the measurement of the S-parameters by the network analyzer to generate the S-parameters as a function of the frequency of the electromagnetic signal applied to the waveguide and the magnetic field applied by the magnet. The electronic processor is further programmed to determine at least one magnetic property of the magnetic layer of the associated multilayer structure based on the measurements of the S-parameters as a function of the frequency of the electromagnetic signal applied to the waveguide and the magnetic field applied by the magnet.

In a nonlimiting illustrative embodiment, a method of testing a multilayer structure containing a magnetic layer is disclosed. One or more network parameters are measured of a waveguide that is electromagnetically coupled with the multilayer structure as a function of frequency and as a function of a magnetic field applied to the multilayer structure during the measuring of the network parameters. Based on the measured one or more network parameters, at least one magnetic property of the magnetic layer of the multilayer structure is determined.

In a nonlimiting illustrative embodiment, a method of testing a multilayer structure containing a magnetic layer is disclosed. One or more network parameters comprising S-parameters, Y-parameters, Z-parameters, H-parameters, T-parameters, or ABCD-parameters are measured of a waveguide that is electromagnetically coupled with the multilayer structure as a function of frequency and as a function of a magnetic field applied to the multilayer structure during the measuring of the network parameters. Based on the measured one or more network parameters, at least one magnetic property of the magnetic layer of the multilayer structure is determined.

In a nonlimiting illustrative embodiment, a method of testing a multilayer structure containing a magnetic layer is disclosed. One or more network parameters are measured of a waveguide that is electromagnetically coupled with the multilayer structure as a function of frequency and as a function of a magnetic field applied to the multilayer structure during the measuring of the network parameters. Based on the measured one or more network parameters, at least one of an effective anisotropy field ($H_k^{eff}$) of the magnetic layer of the multilayer structure and a damping constant α of the magnetic layer of the multilayer structure is determined.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A test device for measuring at least one magnetic parameter of an associated multilayer structure containing a magnetic layer, the test device comprising:
   a waveguide having a recess configured to receive and hold the associated multilayer structure with the waveguide electromagnetically coupled with the associated multilayer structure received by the recess of the waveguide;
   a magnet arranged to superimpose a magnetic field on the associated multilayer structure and a magnetic field sensor; and
   a network analyzer configured to measure network parameters of the waveguide holding and electromagnetically coupled with the associated multilayer structure received by the recess of the waveguide with the magnet superimposing the magnetic field on the associated multilayer structure received by the recess of the waveguide.

2. The test device of claim 1 further comprising:
   an electronic processor programmed to process the measured network parameters to determine at least one magnetic property of the magnetic layer of the associated multilayer structure.

3. The test device of claim 2 wherein the least one magnetic property includes an effective anisotropy field of the magnetic layer of the associated multilayer structure.

4. The test device of claim 2 wherein the least one magnetic property includes a damping constant of the magnetic layer of the associated multilayer structure.

5. The test device of claim 2 wherein the network analyzer is configured to measure the network parameters including one or more S-parameters, Y-parameters, Z-parameters, H-parameters, T-parameters, and/or ABCD-parameters.

6. The test device of claim 1 wherein the waveguide comprises a coplanar wavequide with ground (CPWG) that has a G-S-G structure on a front side of the CPWG wherein the G-S-G structure includes two parallel ground lines and a signal line parallel with and disposed between the two parallel ground lines.

7. The test device of claim 6 wherein the magnet is arranged to generate the magnetic field having a magnetic field vector oriented perpendicular to a direction of the signal line of the CPWG.

8. The test device of claim 1 wherein the waveguide comprises a coplanar waveguide with ground (CPWG).

9. A test device for measuring at least one magnetic parameter of an associated multilayer structure containing a magnetic layer, the test device comprising:
   a waveguide having a recess configured to receive the associated multilayer structure and configured to electromagnetically couple with the associated multilayer structure received by the recess of the waveguide;
   a magnet arranged to superimpose a magnetic field on the associated multilayer structure received by the recess of the waveguide;
   a network analyzer configured to measure S-parameters of the waveguide with the associated multilayer structure received by the recess of the waveguide and electromagnetically coupled with the waveguide and with the magnet superimposing the magnetic field on the associated multilayer structure electromagnetically coupled with the waveguide; and
   an electronic processor programmed to:
      control the network analyzer and the magnet to vary a frequency of an electromagnetic signal applied to the waveguide by the network analyzer and a magnetic field applied by the magnet during the measurement of the S-parameters by the network analyzer to generate the S-parameters as a function of the frequency of the electromagnetic signal applied to the waveguide and the magnetic field applied by the magnet; and
      determine at least one magnetic property of the magnetic layer of the associated multilayer structure based on the measurements of the S-parameters as a function of the frequency of the electromagnetic signal applied to the waveguide and the magnetic field applied by the magnet.

10. The test device of claim 9 wherein the electronic processor is programmed to determine the at least one magnetic property including an effective anisotropy field ($H_k^{eff}$) and/or a damping constant α of the magnetic layer of the magnetic layer.

11. The test device of claim 9 wherein the waveguide comprises a coplanar waveguide.

12. The test device of claim 11 wherein the coplanar waveguide has a G-S-G structure on a front side of the coplanar waveguide wherein the G-S-G structure includes two parallel ground lines and a signal line parallel with and disposed between the two parallel ground lines.

13. The test device of claim 9 wherein the magnet is arranged to generate the magnetic field having a magnetic field vector oriented perpendicular to a direction of a signal line of the coplanar waveguide.

14. A method of testing a multilayer structure containing a magnetic layer, the method comprising:
   mounting the multilayer test structure in a recess of a waveguide;
   with the multilayer test structure mounted in the recess of the waveguide, measuring one or more network parameters of the waveguide that is electromagnetically coupled with the multilayer structure mounted in the recess of the waveguide as a function of frequency and as a function of a magnetic field applied to the multilayer structure mounted in the recess of the waveguide during the measuring of the network parameters; and
   based on the measured one or more network parameters, determining at least one magnetic property of the magnetic layer of the multilayer structure.

15. The method of claim 14 wherein the one or more network parameters comprise S-parameters, Y-parameters, Z-parameters, H-parameters, T-parameters, or ABCD-parameters.

16. The method of claim 14 wherein the determining of the at least one magnetic property includes determining at least one of an effective anisotropy field of the magnetic layer of the multilayer structure and a damping constant of the magnetic layer of the multilayer structure.

17. The method of claim 14 wherein the waveguide comprises a coplanar waveguide with ground (CPWG).

18. The method of claim 17 wherein the CPWG has a G-S-G structure on a front side of the CPWG wherein the G-S-G structure includes two parallel ground lines and a signal line parallel with and disposed between the two parallel ground lines, and the method further comprises;
   electromagnetically coupling the waveguide with the multilayer structure by disposing the multilayer structure on the front side of the CPWG.

19. The method of claim 18 wherein the multilayer structure is disposed on the front side of the CPWG with a gap of one millimeter or less between the multilayer structure and the G-S-G structure.

20. The method of claim 14 wherein the magnetic field is applied to the multilayer structure with a magnetic field vector of the magnetic field oriented perpendicular to a direction of a signal line of the waveguide.

* * * * *